(12) United States Patent
Kitamura et al.

(10) Patent No.: US 6,266,873 B1
(45) Date of Patent: Jul. 31, 2001

(54) METHOD AND APPARATUS FOR MOUNTING ELECTRONIC COMPONENTS

(75) Inventors: Naoyuki Kitamura, Suita; Osamu Okuda; Akira Kabeshita, both of Hirakata; Takeshi Takeda, Osaka, all of (JP)

(73) Assignee: Matsushita Electric Industrial Co., Ltd., Osaka-fu (JP)

( * ) Notice: Subject to any disclaimer, the term of this patent is extended or adjusted under 35 U.S.C. 154(b) by 0 days.

(21) Appl. No.: 09/367,514

(22) PCT Filed: Feb. 16, 1998

(86) PCT No.: PCT/JP98/00644

§ 371 Date: Nov. 18, 1999

§ 102(e) Date: Nov. 18, 1999

(87) PCT Pub. No.: WO98/36629

PCT Pub. Date: Aug. 20, 1998

(30) Foreign Application Priority Data

Feb. 17, 1997 (JP) .................................................. 9-031965
Jun. 6, 1997 (JP) .................................................. 9-148963

(51) Int. Cl.[7] .................................................. H05K 3/30
(52) U.S. Cl. .................................. 29/832; 29/739; 29/740; 29/741; 29/743; 29/832; 29/837; 29/DIG. 44
(58) Field of Search ............................. 29/739, 740, 741, 29/743, 832, 837, DIG. 44

(56) References Cited

U.S. PATENT DOCUMENTS

| | | | |
|---|---|---|---|
| Re. 33,974 | * 6/1992 | Asai | 29/407 |
| 3,777,350 | * 12/1973 | Maeda | 29/203 B |
| 4,293,998 | * 10/1981 | Kawa | 29/564.1 |
| 4,329,776 | * 5/1982 | Mori | 29/741 |
| 4,621,406 | * 11/1986 | Fujiwara | 29/564.2 |
| 4,738,025 | * 4/1988 | Arnold | 29/834 |
| 4,794,689 | * 1/1989 | Seno | 29/740 |
| 4,979,290 | * 12/1990 | Chiba | 29/840 |
| 4,980,971 | * 1/1991 | Bartschat | 29/833 |
| 4,999,909 | * 3/1991 | Eguchi | 29/740 |
| 5,003,692 | * 4/1991 | Izumi | 29/834 |
| 5,084,962 | * 2/1992 | Takahashi | 29/833 |
| 5,208,975 | * 5/1993 | Hidese | 29/832 |
| 5,233,745 | * 8/1993 | Morita | 29/705 |
| 5,379,514 |   1/1995 | Okuda et al. . | |
| 5,727,922 | * 3/1998 | Ikeya | 414/752 |
| 5,944,414 | * 8/1999 | Nishitani | 362/490 |
| 6,076,394 | * 6/2000 | Tsuda | 73/37 |

FOREIGN PATENT DOCUMENTS

0188796A * 12/1985 (EP) .
7-249898A * 8/1995 (JP) .
10-233570A * 9/1998 (JP) .

* cited by examiner

Primary Examiner—Lee Young
Assistant Examiner—Paul D. Kim
(74) Attorney, Agent, or Firm—Price and Gess

(57) ABSTRACT

Method and apparatus for mounting electronic components in which components are efficiently fed and transferred for enhancing productivity is provided. Tray draw-out device (6) is disposed at a component feeding unit (4) for pulling out a tray (3) accommodating electronic components (2) from the component feeding unit (4) to a given pick-up position, where the electronic components (2) are transferred by the transfer mechanism (11) on to a temporary holder (8) disposed on a draw-out arm (7) of the tray draw-out device (6). Mounting head (5) has a plurality of mounting nozzles (5a), with which the mounting head (5) picks up several electronic components (2) aligned on the temporary holder (8) at a time and mount them on to a circuit board (1) which has been loaded and located at a prescribed position.

12 Claims, 6 Drawing Sheets

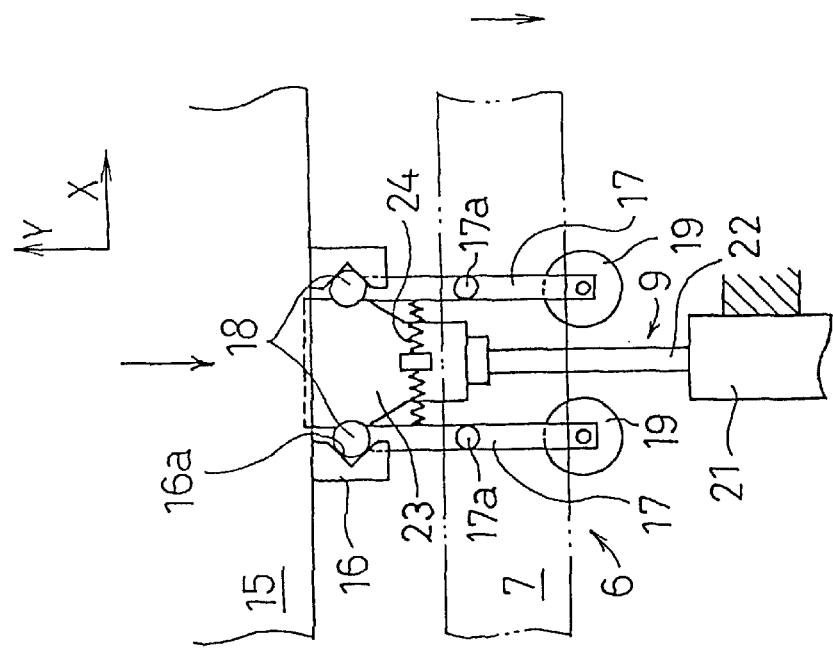
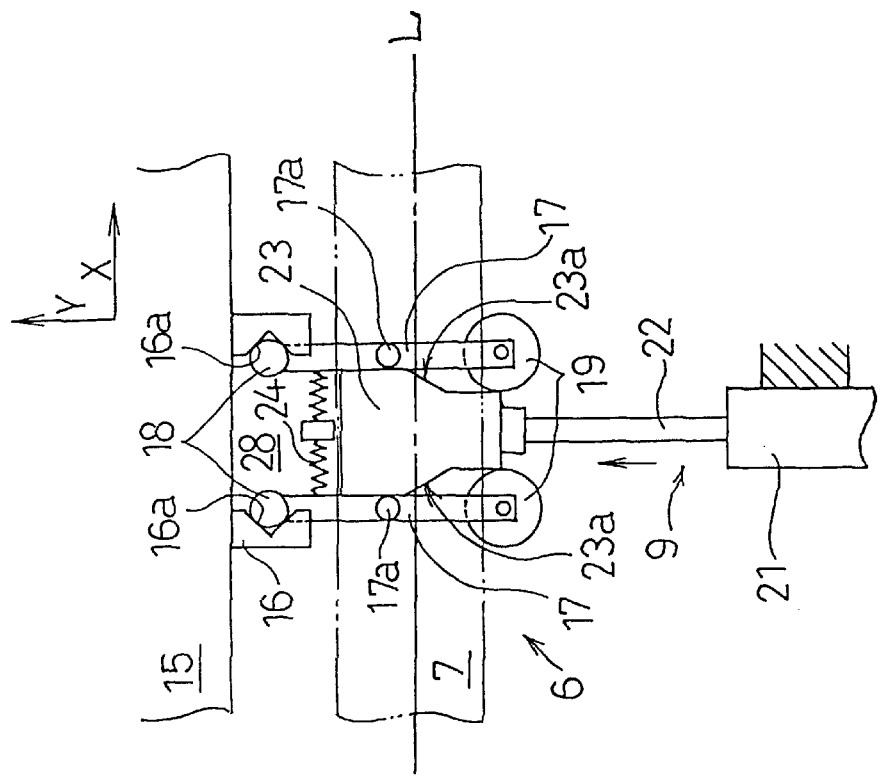

METHOD AND APPARATUS FOR MOUNTING ELECTRONIC COMPONENTS

TECHNICAL FIELD

The present invention relates to a method of and an apparatus for mounting electronic components on to a circuit board.

BACKGROUND ART

One example of a conventional electronic component mounting apparatus is shown in FIG. 6. Electronic component mounting apparatus 30 comprises a loader 39 for carrying in and out a circuit board 1, a component feeding unit 35 which stocks trays 3 loaded with electronic components 2, each tray 3 being fixedly placed on tray shelves stacked in a tray magazine in such a way that the tray 3 accommodating components 2 of desired type is vertically transferred to a proper tray feeding position, a plurality of component feeder reels 32 for supplying electronic components 31 which are stocked in a row on a tape-like member wound around a reel, a mounting head 33 equipped with a suction nozzle 34 which picks up electronic components 2(31) by suction from the component feeding unit 35 or the component feeder reels 32 and mounts them on to the circuit board 1 located at a prescribed mounting position, and an X-Y robot 37 for causing the mounting head 33 to move freely on a plane defined by X and Y axes.

In the above-described arrangement, the mounting head 33 is freely moved by the X-Y robot 37 to pick up components 2(31) from the component feeder reels 32 or the component feeding unit 35 with the suction nozzle 34 and mount them on to the circuit board 1 located at a prescribed position. The posture of the component 2(31) held by the suction nozzle 34 is checked by a component recognizing camera 38 and corrected so as to be mounted precisely at a given mounting position.

Such component mounting action by the mounting head 33 is repeated until all of a given number of components required for one circuit board are completely mounted. Generally, smaller components such as chip components are fed from the component feeder reels 32 whereas components of larger size such as IC or LSI are supplied from the component feeding unit 35 in the apparatus 30 of such kind.

Since the mounting head 33 has only a single suction nozzle 34 in the above described apparatus 30, the mounting head 33 needs to travel between the component feeder reels 32 or the component feeding unit 35 and the mounting position on the circuit board 1 via the recognizing camera each time one component 2(31) is mounted, thus having rather low productivity.

By providing the mounting head 33 with several nozzles so that components 2 are picked up in plurality at one time to perform continuous mounting action, the productivity may be enhanced. However, in order to pick up a plurality of components 2 supplied from the component feeding unit 35, the components 2 need to be preliminarily transferred to a prescribed position and aligned in a given mounting order. For that purpose, it is necessary to provide a transfer mechanism which is capable of picking up components 2 and moving along at least two directions (on X-Y plane) and a temporary holding means on which components are held, causing the entire structure-of the apparatus to be large and complicated.

An object of the present invention is to provide a method and apparatus for mounting electronic components having a component transfer mechanism of simple structure for performing efficient component mounting action with a mounting head provided with several nozzles for picking up a plurality of components at one time, whereby supplying and transferring electronic components are efficiently effected thus improving productivity.

DISCLOSURE OF INVENTION

An electronic component mounting apparatus in which a plurality of electronic components preliminarily aligned in a mounting order at a prescribed position are picked up and held by suction with a plurality of nozzles provided on a mounting head and mounted in succession at prescribed mounting positions on a circuit board, according to one aspect of the present invention, is characterized by having: an electronic component feeding unit in which trays loaded with electronic components are stocked and a tray accommodating electronic components of desired type is successively transferred to a tray feeding position; a tray draw-out means having a draw-out arm for pulling out the tray which has been brought to the tray feeding position by coupling the tray to the draw-out arm and moving the draw-out arm forward and backward so that the electronic components desired to be picked up are brought to locate at a component pick-up position along a component transfer line; a component transfer mechanism which travels along one axis or the component transfer line for picking up by suction the electronic components located at the pick-up position and transferring them; and a temporary holder which is positioned on the component transfer line for holding a plurality of electronic components transferred by the transfer mechanism in a mounting order.

According to the above-described arrangement, the tray which has been transferred to the tray feeding position in the component feeding unit is pulled out by the tray draw-out means by an amount such that the electronic components of desired type are brought to locate on a one-axis transfer line of the transfer mechanism. The transfer mechanism picks up the electronic components by suction and transfers them on to the temporary holder located along the component transfer line. As the temporary holder is capable of holding a plurality of electronic components of which number corresponds to the number of mounting nozzles on the mounting head, several electronic components can be aligned on the temporary holder in the order of mounting operation by repeating the aforementioned transferring operation. The mounting head carries out the mounting operation on to the circuit board by picking up several electronic components at a time from the temporary holder while the transferring of electronic components that are to be mounted next is being effected. Due to the arrangement in which the tray draw-out means controls the amount of pulling out the tray to cause the electronic components to locate on the component transfer line and that the temporary holder is disposed on this component transfer line, the transfer mechanism can be constructed to be movable only along one axis, thus allowing the entire structure of the apparatus to be simple and compact.

The temporary holder may be disposed on the draw-out arm of the tray draw-out means, thereby obviating the need for an extra space for installation, further contributing to the simple and compact structure.

Further, the component feeding unit may have a plurality of tray feeding positions, and the tray draw-out means may be arranged in plurality corresponding to such tray feeding positions, each tray draw-out means including the temporary holder disposed on their respective draw-out arms, whereby transfer locations of the electronic components can be more freely selected, thus enhancing the speed and flexibility of the transferring actions.

Since the transfer mechanism moves along a direction crossing at right angles with the direction of movement of the draw-out arm, the transferring of electronic components can be effected on a plane defined by movement ranges of the draw-out arm and the transfer mechanism along two axes similarly as if achieved by a 2-axis movable robot.

Also, an electronic component mounting apparatus in which a plurality of electronic components preliminarily aligned in a mounting order at a prescribed position are picked up and held by suction with a plurality of nozzles provided on a mounting head and mounted in succession at prescribed mounting positions on a circuit board, according to another aspect of the present invention, is characterized by having: an electronic component feeding unit in which trays loaded with electronic components are stocked and a tray accommodating electronic components of desired type is successively transferred to a tray feeding position; a tray draw-out means having a draw-out arm for pulling out the tray which has been brought to the tray feeding position by coupling the tray to the draw-out arm and moving the draw-out arm forward and backward so that the electronic components desired to be picked up are brought to locate at a component pick-up position along a component transfer line; a component transfer mechanism which travels along one axis or the component transfer line for picking up by suction the electronic components located at the pick-up position and transferring them; a temporary holder which is disposed on the draw-out arm and is capable of holding a requisite number of electronic components thereon; and a switching means provided in the tray draw-out means for coupling the tray to the draw-out arm and for detaching the draw-out arm from the tray so as to allow the draw-out arm to move independently forward and backward and to cause the temporary holder on the draw-out arm to move toward a component feeding line.

Also, a method for mounting electronic components in which a plurality of electronic components preliminarily aligned in a mounting order at a prescribed position are picked up and held by suction with a plurality of nozzles provided on a mounting head and mounted in succession at prescribed mounting positions on a circuit board, according to yet another aspect of the present invention, is characterized in that:

A) a tray loaded with electronic components of desired type is selected from a plurality of trays (3) each accommodating electronic components (2) and transferred to and positioned at a tray feeding position;

B) a draw-out arm is coupled to the tray and moved forward and backward for pulling out the tray which has been located at the tray feeding position so that the desired type of electronic components are brought to locate at a pick-up position on a component transfer line;

C) the electronic components are picked up by suction with a transfer mechanism which moves along one axis on the component transfer line;

D) the draw-out arm is returned to a position on the component transfer line;

E) the electronic components that have been picked up by the transfer mechanism are transferred on to a temporary holder disposed on the draw-out arm;

F) a tray accommodating electronic components desired next is brought to the tray feeding position;

G) the series of actions from B) to F) described above is repeated until a requisite number of electronic components are transferred on to the temporary holder according to a mounting order;

H) the tray is returned to the tray feeding position by means of the draw-out arm where the draw-out arm is released from the tray; and I) the draw-out arm is independently moved to a component feeding line, where the electronic components that have been transferred on to the temporary holder are picked up by nozzles on a mounting head, while at the same time a tray loaded with electronic components desired next is transferred to and positioned at the tray feeding position.

With the apparatus and method of mounting electronic components described above, since the tray draw-out means is constructed such that the draw-out arm can be connected to and detached from the tray at the tray feeding position, allowing the draw-out arm to move forward and backward independently, the draw-out arm can be separately advanced to a position away from the component transfer line, i.e., the component feeding line in the vicinity of the mounting head. It is thereby possible to transfer the tray accommodating the electronic components desired next to the tray feeding position in the component feeding unit while the mounting head is picking up the several electronic components on the temporary holder on the draw-out arm. Therefore, the feeding and transferring of electronic components that are to be mounted next can be efficiently effected during the picking-up and mounting actions of electronic components in plurality by the mounting head. Moreover, the mechanism for temporarily holding the electronic components required for these actions can be constructed with the temporary holder disposed using the space on the arm, and the one-axis movable transfer mechanism of simple structure. Consequently, while keeping the structure of apparatus simple, feeding and transferring electronic components can be expeditioiusly achieved thus enhancing the productivity.

BRIEF DESCRIPTION OF DRAWINGS

FIGS. 4A and 4B are enlarged plan views explaining actions of a tray draw-out means in a state that a switching means is in engagement, respectively showing states in which a draw-out arm is retreated and proceeded.

BEST MODES FOR CARRYING OUT THE INVENTION

One embodiment of the present invention will be hereinafter described referring to the accompanying drawings. It is to be understood that the following embodiments are merely specific examples of the present invention and are not intended to limit the technical scope thereof.

Figure 1:
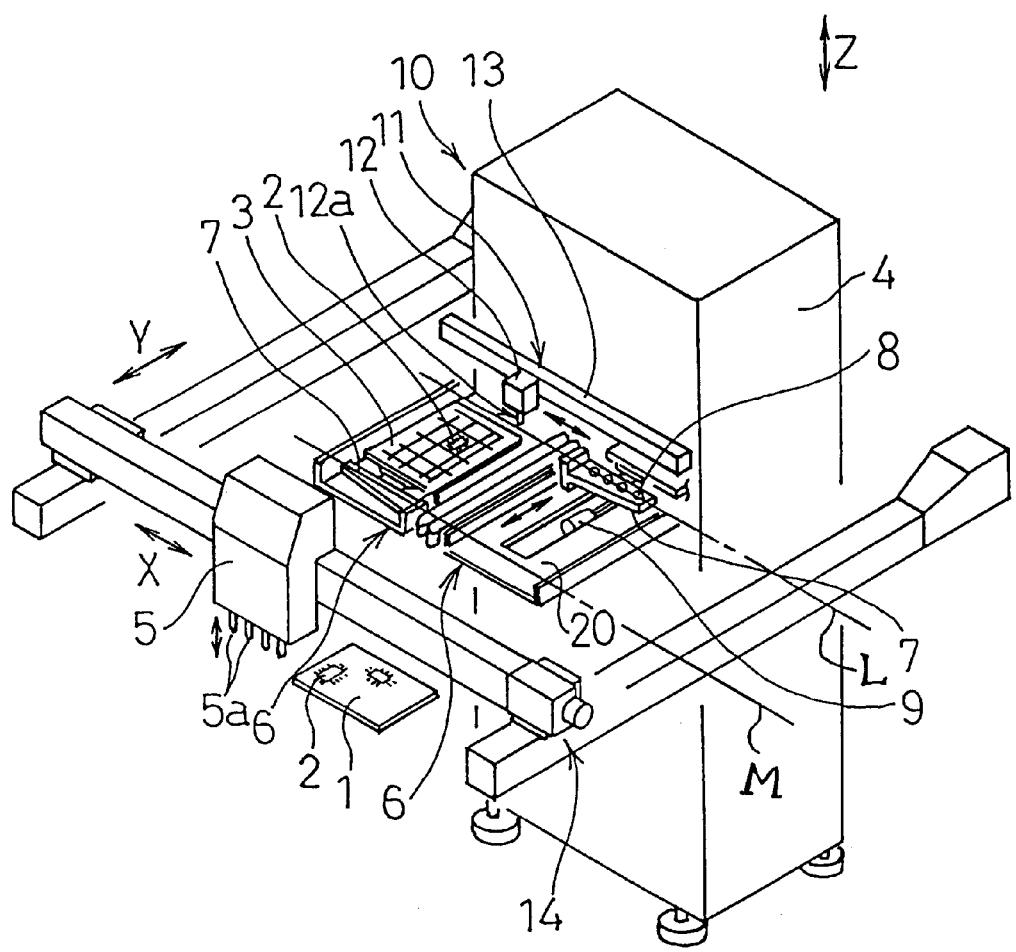
FIG. 1 is a perspective view showing an electronic component mounting apparatus according to one embodiment of the present invention.
Figure 2:
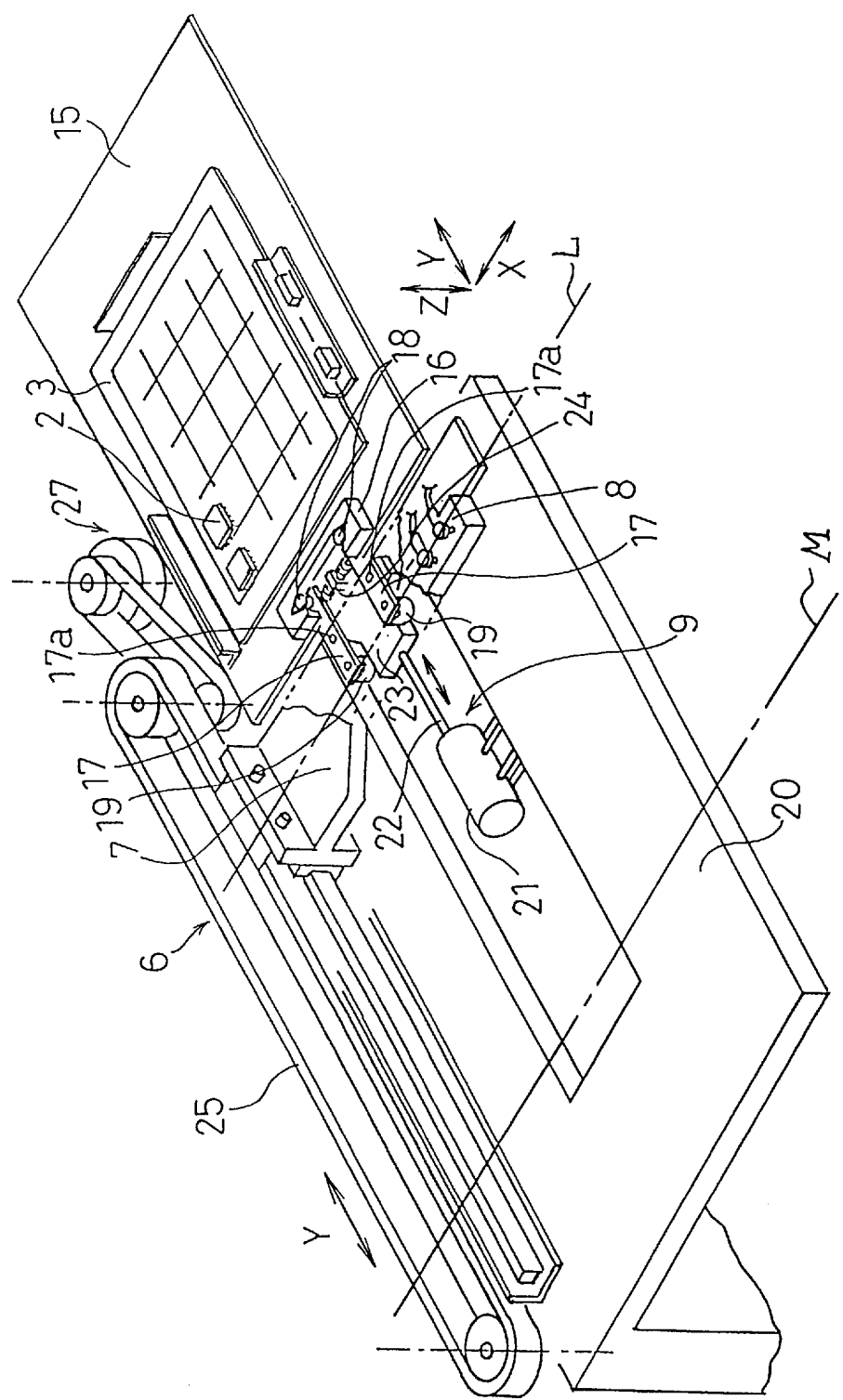
FIG. 2 is an enlarged perspective view showing one of tray draw-out means of the present invention.
Figure 3:
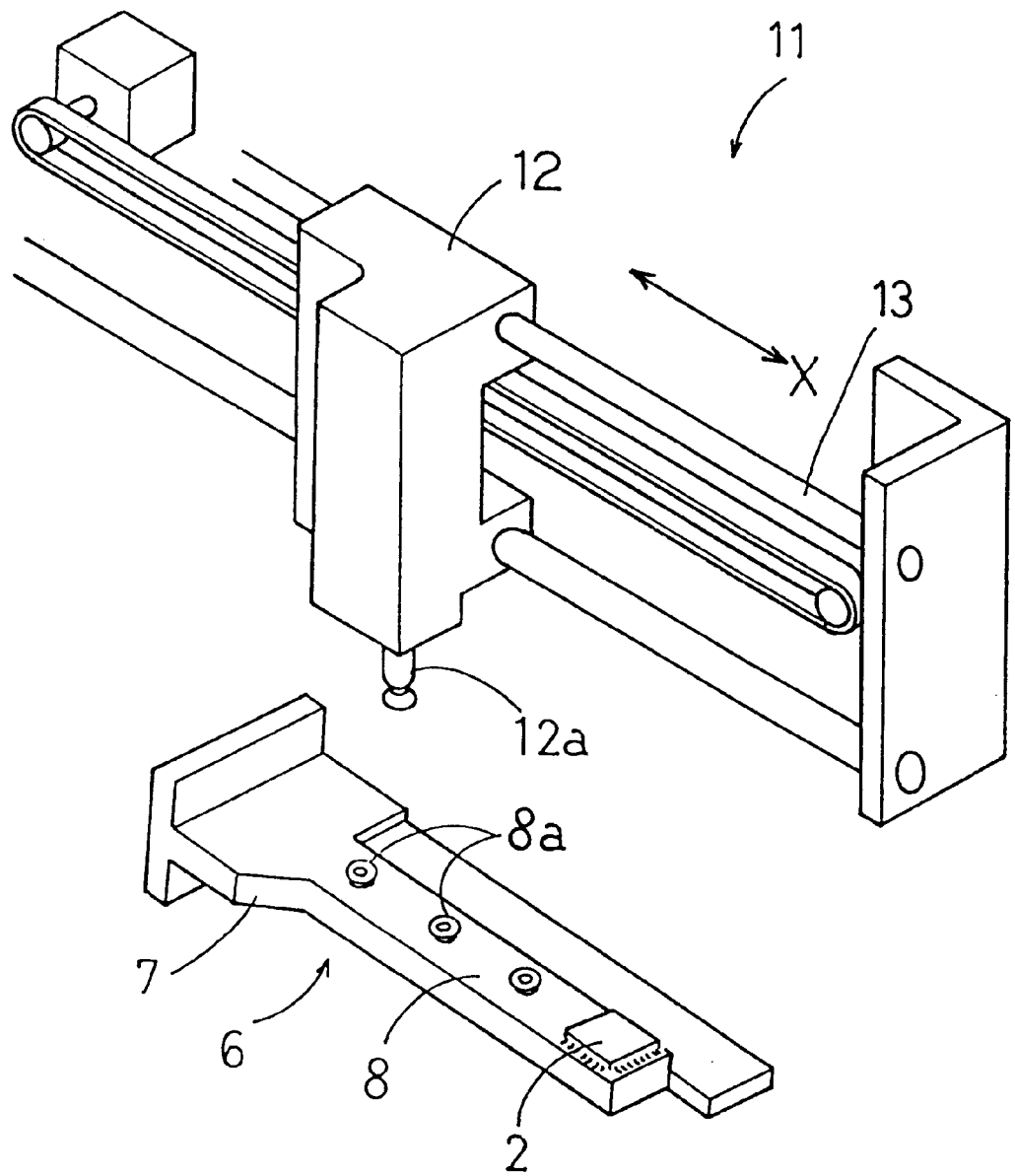
FIG. 3 is a perspective view showing a schematic structure of a transfer mechanism in the present invention.

FIG. 1 is a perspective view showing an electronic component mounting apparatus according to one embodiment of the present invention; FIG. 2 is an enlarged perspective view of one of tray draw-out means of the present invention; and FIG. 3 is a perspective view showing the structure of a transfer mechanism of the present invention.

In FIG. 1, reference numeral 10 denotes the electronic component mounting apparatus, which includes a component feeding unit 4, a pair of tray draw-out means 6, a transfer mechanism 11, a mounting head 5, and an X-Y robot 14. Component feeding unit 4 has a pair of tray magazines arranged side by side in which trays or storage members 3 loaded with electronic components 2 are stacked in several layers in such a way that a tray 3 accommodating components of desired type can be transferred vertically in a direction shown by the arrow Z and positioned at a tray feeding position. Tray draw-out means 6 have their respective draw-out arms 7 for holding the tray 3 of which position has been vertically defined at the tray feeding position and for moving the tray 3 forward and backward in a direction denoted by the arrow Y to cause the electronic components 2 to locate at a pick-up position on a component transfer line L. A temporary holder 8 is provided on the draw-out arm 7 and constructed for holding a plurality of components 2 thereon. Transfer mechanism 11 effects successive transferring of electronic components 2 by traveling sideways along one axis of the component transfer line L in a direction shown by the arrow X to pick up the components 2 positioned on the component transfer line L and transfer them on to the temporary holder 8 according to a mounting order. Mounting head 5 is provided with a plurality of mounting nozzles 5a for attracting by suction several components 2 which have been transferred on to the temporary holder 8 at one time and mounting them on to prescribed mounting positions on the circuit board 1. Mounting head 5 is moved freely on the plane defined by X and Y axes by the X-Y robot 14.

The structure for carrying in and out the circuit board 1, positioning the circuit board 1 at a prescribed location, supplying taped components from the component feeder reels, and for recognizing the posture of the component held by the nozzles 5a are identical to those of the prior art previously described, and thus illustration and further description thereof will be omitted.

Tray draw-out means 6 are constituted as shown in enlarged view of FIG. 2, which only shows an extract of one of the two tray draw-out means 6.

The trays 3 are individually placed on corresponding tray plates 15, which are stacked in a pile arrangement within the tray magazines of the component feeding unit 4. The trays 3 are vertically moved and successively positioned at the tray feeding position based on the order of a mounting program.

The tray draw-out means 6 includes the draw-out arm 7 for pulling out the tray plate 15 which has been brought to the tray feeding position and a motor 27 for driving the arm 7 via a belt 25 forward and backward in a direction shown by the arrow Y so as to be located at any position. The draw-out arm 7 comprises a pair of coupling arms 17 which are engaged with a coupling portion 16 provided on one side in front of the tray plate 15, whereby the tray plate 15 coupled to the arm 7 is pulled out to a given position on a bed 20 when the arm 7 is driven by the belt 25 along the direction of Y. The coupling portion 16 comprises a pair of opposing recesses in the form of letter V 16a, 16a and a space 28 defined between these recesses opened through in the vertical direction Z and toward the draw-out arm 7 side as shown in FIGS. 4A, 4B, 5A, and 5B. The coupling arms 17 and the coupling portion 16 both form a part of a switching means 9 which will be described later.

The amount of movement of the tray plate 15 pulled out on the bed 20 is defined such that the desired electronic components 2 are brought to locate on a movement line of a transfer head 12 in the transfer mechanism 11, i.e., along the component transfer line L, and the rotation of the motor 27 is controlled for effecting such pulling out of the tray plate 15 by the desired amount. After the components 2 are taken out from the tray 3 by the transfer mechanism 11, the draw-out arm 7 returns the tray plate 15 to the tray feeding position within the component feeding unit 4. In other words, the tray draw-out means 6 acts so as to move the draw-out arm 7 both forward and backward in the direction of Y, by which the components 2 on the tray 3 of the tray plate 15 which has been transferred to the tray feeding position in the component feeding unit 4 according to a mounting order can be taken out successively by the transfer mechanism 11.

The arrangement shown in FIG. 2 may be provided in a pair arranged side by side and disposed on a front side of the component feeding unit 4 as shown in FIG. 1.

The transfer mechanism 11 is constituted as shown in the enlarged view of FIG. 3. As shown, the transfer mechanism 11 is disposed above the tray draw-out means 6 and provided with the transfer head 12 which has a suction nozzle 12a and is constructed such as to move on a guide rail 13 along the direction shown by X between the two tray draw-out means 6, 6 corresponding to the two tray magazines. The transfer head 12 transfers electronic components 2 by attracting them by suction with the nozzle 12a from the tray 3 pulled out by the tray draw-out means 6 on to the temporary holder 8 disposed on the draw-out arm 7. This transferring action can be expeditiously carried out by controlling the transfer mechanism 11 to alternatively pick up given components 2 from a tray 3 pulled out by one of tray draw-out means 6 and place the same on to a temporary holder 8 on the draw-out arm 7 of another tray draw-out means 6. The temporary holder 8 may be provided on only one of the draw-out arms 7. In such a case, when electronic components 2 are taken out by the transfer mechanism 11 from the tray 3 pulled out by the arm 7 with the temporary holder 8, the arm 7 acts to cause the tray 3 to return to a prescribed position so that the electronic components 2 can be transferred on to the temporary holder 8.

The temporary holder 8 has suction pads 8a of which their number corresponds with the number of mounting nozzles 5a provided on the mounting head 5, which are a given number of electronic components 2 to be transferred by the transfer head 12. Suction pads 8a are aligned along the direction of arrow X to correspond with the arrangement of the mounting nozzles 5a of the mounting head 5 and hold the prescribed number of electronic components 2 transferred thereto.

Directions of movements of the tray draw-out means 6 and the transfer mechanism 11 are X-axis and Y-axis directions, respectively, which are crossing each other. Thus, the transfer head 12 can be constituted such as to be capable of moving along only one axis for conveying electronic components 2 from a given position on the tray 3 on to temporary holder 8. Such simple structure of one axis movement allows both configuration and control of transfer mechanism 11 to be simplified. Also, the temporary holder 8 is disposed on the arm 7 of the tray draw-out means 6, obviating the need to provide an extra space for installation, thereby contributing to compact and simple structure of the apparatus.

Transferring of electronic components 2 can be achieved while the mounting head 5 is successively picking up several components 2 at a time held on temporary holder 8 and mounting them on to the circuit board 1. More specifically, while the mounting head 5 moves to a component recognizing position (not shown) with its nozzles 5a attracting by suction a plurality of components 2, where the posture of each component 2 is recognized and corrected based on the results of recognition, after which the components 2 are successively mounted at prescribed positions on the circuit board 1, the transfer mechanism 11 picks up electronic components 2 which are required in the next cycle of mounting operation from the tray 3 pulled out by the draw-out arm 7 and transfers them to the temporary holder 8 according to the predetermined order, whereby supplying and transferring of components 2 can be efficiently effected.

As set forth above, the apparatus of the present invention is constituted such that the temporary holder 8 on which components 2 are prepared in the mounting order is disposed on the draw-out arm 7; the transfer mechanism 11 for carrying components 2 to the temporary holder 8 is constructed to be able to move only along one-axis movement line, i.e., the component transfer line L, in the X-axis direction which is crossed at right angles with the movement direction of draw-out arm 7 in the Y-axis direction; and the arm 7 of the tray draw-out means 6 is designed to be able to pull out the tray 3 to any given position, thus preventing the overall structure from being large scale and complicated. Components 2 are aligned in the order of mounting and supplied for the next cycle of mounting operation, thereby efficient actions of picking up components and mounting them to the circuit board 1 can be carried out.

After the prescribed number of electronic components 2 are deposited on the temporary holder 8 on the draw-out arm 7, it will be favorable that the draw-out arm 7 is constructed such as to be able to proceed to the component feeding line M in the vicinity of the mounting head 5, so that the actions of picking up a plurality of components 2 and mounting them on to the circuit board 1 by the mounting head 5 can be swiftly carried out. However, if the tray 3 remained connected to the draw-out arm 7 when the arm is proceeded and thus in a state of being drawn out, another tray 3 accommodating electronic components 2 desired to be mounted in the next mounting operation could not be transferred to and vertically positioned at the tray feeding position in the component feeding unit 4, In order to avoid such an unfavorable situation, the electronic component mounting apparatus 10 of the present invention has a switching means 9 provided in the tray draw-out means 6 for engaging and disengaging the tray 3 and the draw-out arm 7 as show in FIGS. 2, 4A, 4B, 5A, and 5B.

The switching means 9 is shown in FIG. 2 and comprises the pair of right and left coupling arms 17, 17 pivotally supported in the middle at its upper surface by corresponding pivotal axes 17a, 17a provided on a lower surface of the draw-out arm 7, a pair of right and left coupling rollers 18, 18 respectively supported at distal ends on the upper surface of the coupling arms 17, 17, a spring 24 which urges the pair of coupling arms 17, 17 toward a direction such as to bring the coupling rollers 18, 18 apart from each other, another pair of rollers 19, 19 supported at the proximal ends on the lower surface of the coupling arms 17, 17, a cam 23 which acts by contacting the rollers 19, 19, and a cylinder 21 fixed to the lower face of the bed 20 for driving the cam 23 forward and backward in the direction of Y via a shaft 22. The switching means 9 is constructed such that when the pair of rollers 19, 19 are pushed apart by a cam surface 23a of the cam 23, the coupling rollers 18, 18 are brought closer to each other against the force of the spring 24 and thus released from the coupling portion 16 of the tray plate 15.

More specifically, when the cam 23 driven by the cylinder 21 is in an advanced position as shown in FIGS. 4A and 4B, in both cases where the draw-out arm 7 is located on the component transfer line L and the tray plate 15 is at the tray feeding position as shown in FIG. 4A, and where the draw-out arm 7 is proceeded and the tray plate 15 is located at a drawn-out position as shown in FIG. 4B, the cam surface 23a of the cam 23 does not contact the pair of rollers 19, 19, thus keeping the coupling rollers 18, 18 which are urged by the spring 24 to be engaged with the V-shaped recesses 16a, 16a of the coupling portion 16 so that the tray plate 15 moves forward and backward with the draw-out arm 7.

Figure 5A:
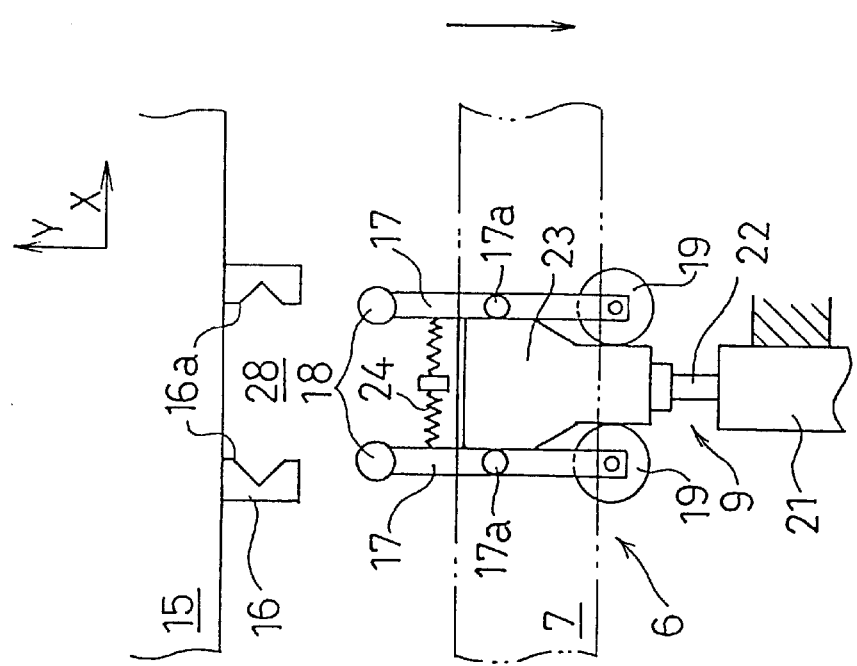
FIGS. 5A and 5B are enlarged plan views explaining actions of a tray draw-out means in a state that a switching means is released, respectively showing states in which a draw-out arm is retreated and proceeded.
Figure 5B:
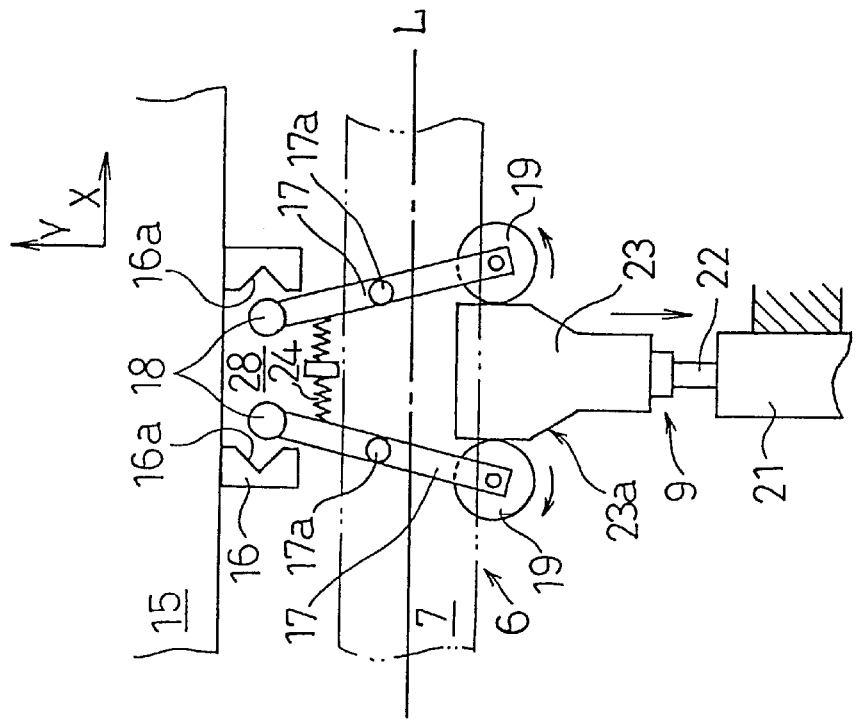

On the other hand, as shown in FIG. 5A, when the cam 23 is retreated in a state where the draw-out arm 7 locates on the component transfer line L and the tray plate 15 stays at the tray feeding position, the rollers 19, 19 are pushed apart by the cam surface 23a of the cam 23 to cause the coupling rollers 18, 18 to be freed from the V-shaped recesses 16a, 16a of the coupling portion 16, thereby releasing the draw-out arm 7 from the tray plate 15, thus allowing free vertical movements of the tray plate 15. The draw-out arm 7 can also thereby move forward and backward independently in the direction of Y as shown in FIG. 5B, allowing a tray 3 accommodating electronic components 2 desired next to be vertically positioned at the tray feeding position in the component feeding unit 4.

As mentioned above, the draw-out arm 7 is driven by the belt 25 in the direction of Y to pull out the tray plate 15 connected thereto by the coupling arms 17, 17 to a prescribed position on the bed 20. The amount of drawing out the tray plate 15 is controlled such that the electronic components 2 to be picked up come to locate on the component transfer line L of the transfer head 12. The draw-out arm 7 can be also controlled such as to cause the temporary holder 8 which is provided on the upper surface of the arm 7 to locate on the component feeding line M, which is a position where a plurality of electronic components 2 are supplied to the mounting head 5, as well as the component transfer line L of the transfer head 12.

As set forth above, the tray draw-out means 6 is constructed such that the draw-out arm 7 can be connected to and detached from the tray 3 at the tray feeding position so as to allow the draw-out arm 7 to travel independently forward and backward. The draw-out arm 7 alone can be thus advanced to the above-mentioned component feeding line M that is away from the component transfer line L. Consequently, a tray 3 loaded with electronic components 2 which need to be mounted next can be vertically positioned at the tray feeding position in the component feeding unit 4 while the mounting head 5 is picking up the several components 2 placed on the temporary holder 8 on the draw-out arm 7.

A method of mounting electronic components in the above-described construction is implemented as described below. First, a tray 3 loaded with desired type of electronic components 2 is brought to the tray feeding position in the component feeding unit 4. The tray 3 is coupled to the draw-out arm 7 that is located along the component transfer line L and pulled out by a certain amount such that the desired electronic components 2 come to position along the component transfer line L where they are to be picked up. The electronic components 2 are then picked up by the transfer head 12 which moves along one axis of the component transfer line L, after which the draw-out arm 7 returns to bring the tray 3 back to the tray feeding position and frees the tray 3. While the transfer head 12 transfers the picked-up electronic components 2 on to the temporary holder 8 on the draw-out arm 7, if tray exchange is necessary, the tray 3 accommodating electronic components desired next is vertically transferred to the tray feeding position in the component feeding unit 4, and if tray needs not to be exchanged, the tray 3 stays for further use.

Next, the above described series of actions is repeated until all the requisite number of electronic components 2 are transferred in the mounting order on the temporary holder 8, after which the draw-out arm 7 returns to bring the tray 3 back to the tray feeding position, where the draw-out arm 7 is released form the tray plate 15 and advanced independently for causing the several electronic components 2 placed on the temporary holder 8 to locate on the component feeding line M. Meanwhile, the next tray 3 is transferred to the tray feeding position in the component feeding unit 4. After the electronic component 2 held in plurality on the temporary holder 8 positioned on the component feeding line M have been at one time picked up by suction with the mounting nozzles 5a on the mounting head 5, the draw-out arm 7 is returned to the component transfer line L and coupled to the next tray 3 to carry out the next cycle of operation for feeding and transferring electronic components 2. At the same time, the mounting head 5 carries out mounting actions of electronic components 2 picked up by the mounting nozzles 5a at the mounting positions on the circuit board 1.

As set forth above, feeding and transferring of electronic components 2 which are to be mounted next can be efficiently effected during the component picking-up and mounting actions of the mounting head 5. Moreover, the mechanism for temporarily holding components required for these actions can be constructed with a temporary holder 8 disposed in the space on the draw-out arm 7 and the transfer mechanism 11 of simple single-axis structure. Accordingly, while keeping the structure of the apparatus simple, the component feeding and transferring actions can be expeditiously carried out thus enhancing productivity.

Figure 6:
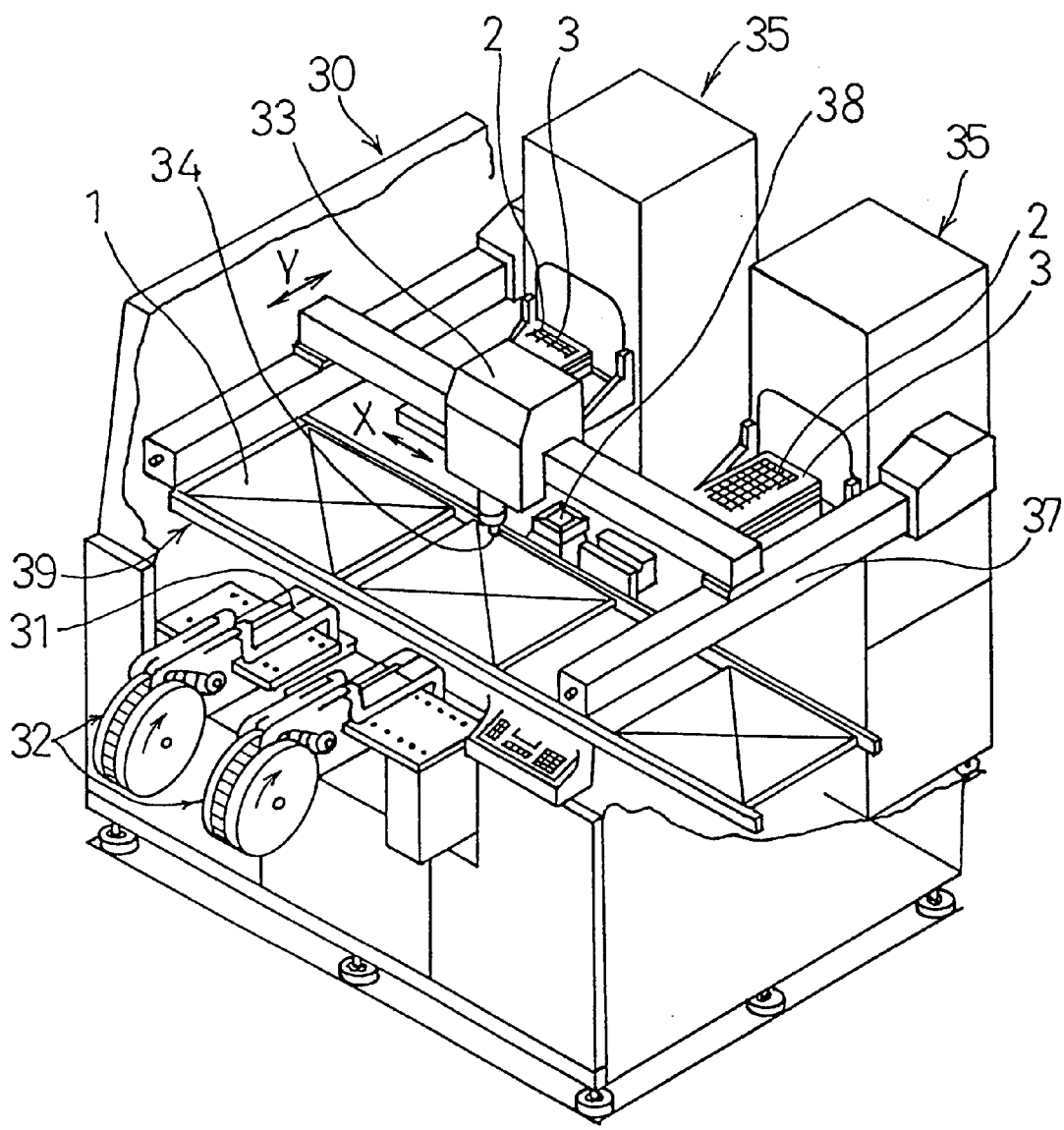
FIG. 6 is a perspective view showing one example of a conventional electronic component mounting apparatus.

Although the component feeder reel 32 as in the structure of the conventional apparatus shown in FIG. 6 is omitted in the electronic component mounting apparatus 10 described above, it is of course possible to incorporate such component feeder reel in the apparatus 10, in which case electronic components 2 can be fed and transferred in plurality from the component feeding unit 4 due to the above described construction while the mounting head 5 is picking up components 2 from the component feeder reel 32 and mounting them, whereby efficient component mounting can be achieved.

INDUSTRIAL APPLICABILITY

As described above, the electronic component mounting apparatus of the present invention is capable of efficiently feeding and transferring electronic components which are to be mounted next during several electronic components are at one time picked up and mounted by the mounting head, thus being useful as an electronic component mounting device which is desired to have high productivity.

What is claimed is:

1. An electronic component mounting apparatus in which a plurality of electronic components preliminarily aligned in a mounting order at a prescribed position are picked up and held by suction with a plurality of nozzles provided on a mounting head and mounted in succession at prescribed mounting positions on a circuit board comprising:

an electronic component feeding unit in which trays loaded with electronic components are stocked and a tray accommodating electronic components of desired type is successively transferred to a tray feeding position;

a tray draw-out means having a draw-out arm for pulling out the tray which has been brought to the tray feeding position by coupling the tray to the draw-out arm and moving the draw-out arm forward and backward so that the electronic components desired to be picked up are brought to locate at a component pick-up position along a component transfer line;

a component transfer mechanism which travels along one axis of the component transfer line for picking up by suction the electronic components located at the pick-up position and transferring them; and a temporary holder which is positioned on the component transfer line for holding a plurality of electronic components transferred by the transfer mechanism in a mounting order.

2. An electronic component mounting apparatus according to claim 1, in which the temporary holder is disposed on the draw-out arm of the tray draw-out means.

3. An electronic component mounting apparatus according to claim 1, in which the electronic component feeding unit is provided with a plurality of tray feeding positions and the tray draw-out means is provided in plurality corresponding to the tray feeding positions and disposed in parallel, and the draw-out arms of each tray draw-out means have their respective temporary holders thereon.

4. An electronic component mounting apparatus according to claim 1, in which the transfer mechanism is constructed to move in a direction crossing at right angles with a direction of movement of the draw-out arm of the tray draw-out means.

5. The electronic component mounting apparatus according to claim 2, in which the transfer mechanism is constructed to move in a direction crossing at right angles with a direction of movement of the draw-out arm of the tray draw-out means.

6. The electronic component mounting apparatus according to claim 3, in which the transfer mechanism is constructed to move in a direction crossing at right angles with a direction of movement of the draw-out arm of the tray draw-out means.

7. An electronic component mounting apparatus in which a plurality of electronic components preliminarily aligned in a mounting order at a prescribed position are picked up and held by suction with a plurality of nozzles provided on a mounting head and mounted in succession at prescribed mounting positions on a circuit board comprising:

an electronic component feeding unit in which trays loaded with electronic components are stocked and a tray accommodating electronic components of desired type is successively transferred to a tray feeding position;

a tray draw-out means having a draw-out arm for pulling out the tray which has been brought to the tray feeding position by coupling the tray to the draw-out arm and moving the draw-out arm forward and backward so that the electronic components desired to be picked up are brought to locate at a component pick-up position along a component transfer line;

a component transfer mechanism which travels along one axis or the component transfer line for picking up by suction the electronic components located at the pick-up position and transferring them;

a temporary holder which is disposed on the draw-out arm and is capable of holding a requisite number of electronic components thereon; and a switching means provided in the tray draw-out means for coupling the tray to the draw-out arm and for detaching the draw-out arm from the tray so as to allow the draw-out arm to move independently forward and backward and to cause the temporary holder on the draw-out arm to move toward a component feeding line.

8. An electronic component mounting apparatus comprising:

an electronic component feeding unit having at least one tray loaded with electronic components;

a tray draw-out assembly having a draw-out arm that is removably coupled with the tray, the draw-out arm is movable so that the electronic components are brought to a component pick-up position along a component transfer line;

a component transfer mechanism which travels along the component transfer line for picking up the electronic components located at the pick-up position and transferring them;

a temporary holder operatively coupled to the draw-out arm for holding a plurality of electronic components transferred by the transfer mechanism; and a mounting head for removing the electronic components from the temporary holder for placing them on a circuit board.

9. The electronic component mounting apparatus of claim 8, wherein the tray draw-out assembly includes a coupling mechanism mounted beneath a plane containing the draw-out arm for selective coupling with the tray, whereby the tray can be initially moved to provide electronic components at a component transfer line, the temporary holder is mounted on the draw-out arm and the coupling mechanism can release the tray and permit the draw-out arm to be moved to a load station for the mounting head independent of the tray.

10. The electronic component mounting apparatus of claim 9, wherein the coupling mechanism includes a pair of pivoting coupling arms for grasping the tray and a cam member for moving the coupling arms.

11. In an electronic component mounting apparatus for supplying component parts from a tray to a mounting head for mounting on a circuit board, the improvement comprising:

a storage member for holding a plurality of electronic components in an X-Y alignment;

a first coupling assembly on the storage member;

a reciprocating tray draw-out assembly including a draw-out arm with a second coupling assembly on the draw-out arm for removable engagement with the first coupling assembly;

a temporary holder for the electronic components mounted on the draw-out arm;

a component transfer mechanism movably mounted to extend across a movement direction of the storage member to secure and remove electronic components from the storage member and to place them on the temporary holder; and a mounting head for removing the electronic components from the temporary holder when the draw-out arm second coupling assembly is released from the storage member and moves the temporary holder to a load station.

12. A method for mounting electronic components in which a plurality of electronic components, preliminarily aligned in a mounting order at prescribed positions, are picked up and held by suction with a plurality of nozzles provided on a mounting head and mounted in succession at prescribed mounting positions on a circuit board, comprising the steps of:

A) selecting a tray loaded with electronic components of a desired type from a plurality of trays, each accommodating electronic components, and transferring the selected tray to a tray feeding position;

B) moving a draw-out arm coupled to the selected tray for pulling out the tray, so that the desired type of electronic components are located at a pick-up position along a component transfer line;

C) picking up the electronic components by suction with a transfer mechanism which moves along one axis on the component transfer line;

D) returning the draw-out arm to a position on the component transfer line;

E) transferring the electronic components that have been picked up by the transfer mechanism onto a temporary holder disposed on the draw-out arm;

F) positioning another tray having electronic components at the tray feeding position;

G) the series of steps from B) to F) described above are repeated until a requisite number of electronic components are transferred onto the temporary holder according to a desired mounting order;

H) releasing the draw-out arm from connection to a tray; and

I) moving the draw-out arm independently to a component feeding line, where the electronic components that have been transferred onto the temporary holder are picked up by nozzles on a mounting head, while a tray loaded with electronic components is transferred to a position at the tray feeding position.

* * * * *